United States Patent [19]

Lindmayer et al.

[11] 3,922,774

[45] Dec. 2, 1975

[54] TANTALUM PENTOXIDE ANTI-REFLECTIVE COATING

[75] Inventors: Joseph Lindmayer, Bethesda; James Frederick Allison, Silver Springs, both of Md.

[73] Assignee: Communications Satellite Corporation, Washington, D.C.

[22] Filed: Feb. 1, 1974

[21] Appl. No.: 438,840

Related U.S. Application Data

[63] Continuation of Ser. No. 249,024, May 1, 1972, abandoned.

[52] U.S. Cl. .................... 29/572; 29/578; 148/6.3; 204/15; 96/36.2; 357/30; 136/89

[51] Int. Cl.[2] ........................................ B01J 17/00

[58] Field of Search ............... 29/572, 578; 96/36.2; 136/89; 204/15; 148/6.3

[56] References Cited

UNITED STATES PATENTS

| | | | |
|---|---|---|---|
| 3,447,958 | 6/1969 | Okutsu | 148/6.3 |
| 3,447,973 | 6/1969 | DeLong | 148/6.3 |
| 3,533,850 | 10/1970 | Tarneja | 136/89 |
| 3,567,508 | 3/1971 | Cox | 96/36.2 |
| 3,665,346 | 5/1972 | Orr | 204/15 |

OTHER PUBLICATIONS

"Metallurgy of the Rarer Materials–6 Tantalum and Niobium," by G. L. Miller, 1959, pages 488 and 489.

*Primary Examiner*—W. Tupman
*Attorney, Agent, or Firm*—Sughrue, Rothwell, Mion, Zinn & Macpeak

[57] ABSTRACT

A solar cell, responsive to light in the short wavelength region, including a non-crystalline tantalum pentoxide, anti-reflective coating. A method for making a solar cell, responsive to light in the short wavelength region including a non-crystalline tantalum pentoxide, anti-reflective coating. The method includes placing the anti-reflective coating and a metallic current collector on the top surface of the solar cell using the technique of "lift-off" photolithography and the oxidation of elemental tantalum which is evaporated onto the solar cell.

13 Claims, 13 Drawing Figures

TANTALUM PENTOXIDE ANTI-REFLECTIVE COATING

This is a Continuation, of application Ser. No. 249,024, filed May 1, 1972, now abandoned.

BACKGROUND OF THE INVENTION

This invention relates to solar cells having a non-crystalline tantalum pentoxide, anti-reflective coating and a method for making such solar cells.

The use of photovoltaic devices, commonly known as solar cells, which convert light energy to useful electrical energy, is well known. Light entering these solar cells is absorbed, thereby generating electron-hole pairs (i.e. carriers) which are then spacially separated by an electric field produced by the solar cell junction. The electrons and holes then diffuse to respective top and bottom surfaces of the solar cell where they are collected by metallic contacts. For example, in an n-p type solar cell electrons will travel to the top surface of the solar cell where they will be collected by a metallic grid positioned thereon. Holes, on the other hand, will travel to the bottom surface of the solar cell where they will be collected by a metallic contact positioned thereon.

The efficiency (i.e. power output/power input) of a solar cell is directly related to the amount of useful light, i.e. carrier generating light, which is absorbed by the solar cell. The efficiency of the solar cell is limited, however, by a known optical phenomena whereby some of the light (both useful and non-useful) striking the top surface of the solar cell is partially reflected from the solar cell. To reduce this problem of light reflection prior art solar cells employ an anti-reflective coating positioned on the surface of the solar cell through which light enters.

To function properly the anti-reflective coating must possess, among other things, certain optical properties. With respect to one of its optical properties, the anti-reflective coating should reduce reflection of the useful light. More specifically, in space applications, for example, wherein a quartz cover slide is usually placed over the anti-reflective coating to prevent harmful radiation such as protons from damaging the solar cell, the index of refraction of the anti-reflective coating should be between that of the quartz cover slide and the underlying solar cell, as is known. In connection with one other optical property, i.e. its absorption property, the anti-reflective coating should not absorb the useful light, but should enable the passage of such light to the underlying solar cell. The use of a particular anti-reflective material is, therefore, dependent upon the refractive index of the underlying solar cell and the cover slide, as well as the wavelength response of that solar cell.

In the U.S. Pat No. 3,533,850 by Tarneja, et al there is disclosed the use of several anti-reflective materials which have the proper optical properties in terms of refractive index and absorption when used in connection with a quartz cover slide and a solar cell having a response to light in the mid-wavelength range, i.e., 0.5–10.75 microns. Tarneja, et al has disclosed that anti-reflective materials having an index of refraction between 2.0 and 2.5 must be used for such solar cells. Tarneja, et al has disclosed 5 specific materials for use with solar cells having a response to light in the mid-wavelength range, as noted above. These materials include an oxide of metals such as zinc, cerium, tin, titanium and tantalum, as well as sulfphide of zinc.

Several problems arise, however, in connection with a choice of anti-reflective material for use in solar cells which use a quartz cover slide, but have an extended response to light in the ultraviolet or short wavelength region (i.e., 0.3–0.5 microns). Such a solar cell has been described in patent application No. 184,393, entitled "Fine Geometry Solar Cell" by Joseph Lindmayer now U.S. Pat. No. 3,811,954 issued May 21, 1974, assigned to the assignee of the present invention. The anti-reflective coating to be used with a solar cell of a type described in the Lindmayer application should have a refractive index between 2.0 and 2.5, as noted in Tarneja, et al; however, the coating should not absorb light in the short wavelength region, i.e., 0.3–0.5 microns. The selection of a particular anti-reflective material from all available materials including those described in Tarneja, et al, for use with short wavelength responsive cells is not at all evident. This is because the refractive indices of oxides of a particular metal (e.g. $Ta_xO_y$) are predictable since the indices do not vary significantly one from the other (e.g. $Ta_2O_{4.5}$ is similar to $Ta_2O_5$); however, the absorption property of such oxides vary significantly, and in random order, from each other (e.g. $Ta_2O_{4.5}$ is much different than $Ta_2O_{4.7}$).

Another problem relates to an appropriate method for producing a layer of anti-reflective coating and a metallic contact on a solar cell. The method will depend upon the particular anti-reflective material used. For example, the method described by Tarneja, et al requires etching of the wet anti-reflective material. The anti-reflective material of the present invention is highly resistant to etching; consequently, the method described by Tarneja, et al is not suitable for placing such an anti-reflective material on the solar cell.

There are, in addition to those already mentioned, other criteria for using an appropriate anti-reflective coating for use with solar cells responsive to light in the short wavelength region. In short wavelength responsive solar cells of a type described in the above-mentioned patent application to Lindmayer, the p-n junction is only about 1000 A from the surface of the solar cell. This means that the anti-reflective coating itself, and the method for incorporating it with such solar cells, may have an effect on the quality of the p-n junction. Consequently, the anti-reflective coating should comprise components which will not penetrate into the solar cell to damage the p-n junction. Also, any stress produced at the anti-reflective coating-solar cell interface must be small so that such stress will not penetrate to the p-n junction and thereby damage it. Also, the method of forming the anti-reflective layer on the solar cell should not introduce unwanted impurities which might penetrate into the solar cell and adversely affect the p-n junction. In addition, the anti-reflective coating should not degrade upon exposure to ultraviolet light in a vacuum. The effect of such degradation is a changing of the index of refraction and the development of absorption at short wavelengths. Also, with respect to silicon solar cells, there is a phenomena known as dispersion whereby the index of refraction increases with shorter wavelengths. Therefore, the anti-reflective coating should have a dispersion relation with wavelength that matches the rising refractive index of silicon.

Still other criteria relating to the use of anti-reflective coatings relate to its stability, adhesion qualities and hardness. The anti-reflective material should be chemically stable in that it should not change composition during processing where it may be exposed to temperature, chemicals and moisture, and should not change during shelf storage so as to avoid significant changes in its refractive index or absorption properties. The adhesion of the anti-reflective coating to the solar cell should be excellent so as not to delaminate or come off in patches during processing or exposure to moisture or temperature cycling. Finally, the anti-reflective material should be hard enough so that it would not be damaged, for example, during coverslide attachment.

The anti-reflective coating of the present invention, and method for incorporating it onto the solar cell, meets all of the above criteria.

SUMMARY OF THE INVENTION

Non-crystalline tantalum pentoxide ($Ta_2O_5$) is used as an anti-reflective coating with solar cells having a response to light in the short wavelength (<0.5 microns) region. The basic process for making a solar cell having a non-crystalline tantalum pentoxide, anti-reflective coating with proper absorption characteristics includes placing elemental tantalum on the top surface of a solar cell and then oxidizing it to obtain amorphous, tantalum pentoxide. Elemental tantalum is placed on the solar cell by the technique of electron beam evaporation and then either thermally or anodically oxidized. Specific "lift-off" photolithography techniques are employed to provide the top surface of the solar cell with a metallic grid which collects the photocurrent.

DETAILED DESCRIPTION OF THE DRAWINGS

The anti-reflective material of the present invention is non-crystalline tantalum pentoxide ($Ta_2O_5$). Tantalum pentoxide is an oxide of tantalum which is stoichiometric, i.e., an oxide of tantalum wherein there are no free valence electrons. As indicated previously, the inventors of the present invention have found non-crystalline $Ta_2O_5$ prepared by oxidizing elemental tantalum to be particularly suitable for use with solar cells having a response to light in the short wavelength (<0.5 microns) region.

Figure 1:
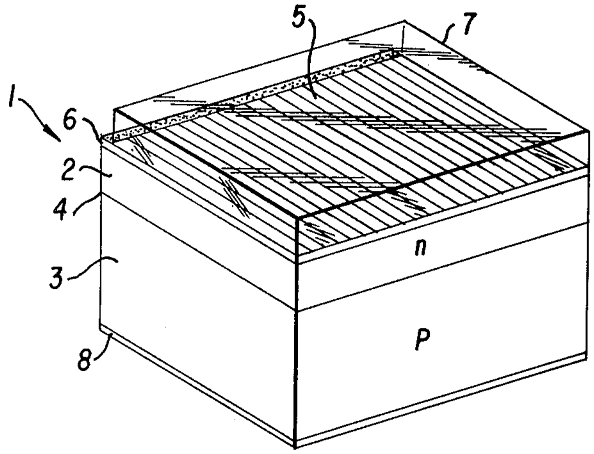
FIG. 1 is a three dimensional view of a solar cell having a non-crystalline tantalum pentoxide anti-reflective coating.

Referring to FIG. 1, there is shown a solar cell 1 having a layer 2 of first type conductivity separated from a layer 3 of second type conductivity by a junction 4. Of course, it should be realized that such dimensions as the size of the solar cell and relative thickness of the several layers shown in FIG. 1 are not representative of an actual solar cell, but are shown, as is, merely for purposes of illustration. The present invention has applicability to all types of solar cells; however for purposes of example this disclosure will relate to a silicon solar cell 1, of a type described in the above mentioned application to Lindmayer, having an n-type layer 2 separated from a p-type layer 3 by a shallow p-n junction 4 which is about 1000 A from the top surface of layer 2. On the top surface of n-type layer 2 is a metallic grid 5 and an anti-reflective coating 6. As will be more fully described below, the anti-reflective coating 6 may occupy those areas of the top surface of layer 2 not occupied by the metallic grid 5. The metallic grid 5 may be of a fine geometry type comprising about 60 metallic current collecting fingers, as disclosed in the above-mentioned application to Lindmayer, or any other metallic grid known in the art. In accordance with the present invention the anti-reflective coating 6 comprises amorphous, tantalum pentoxide. A quartz cover slide 7, of a type known in the art, covers the anti-reflective coating 6 and metallic grid 5. On the bottom of p-type layer 3 is a back metallic contact 8, also of any type known in the art, which may fully cover the entire back surface of layer 3. Not shown in FIG. 1 are interconnectors which may interconnect metallic grid 5 of one solar cell to metallic contact 8 off another cell for purposes of forming a series-parallel solar array, as is well-known.

The method for making a silicon solar cell having a non-crystalline tantalum pentoxide, anti-reflective coating will now be described. The starting point is a slice of silicon which is cut into a predetermined dimension suitable for use in a solar array. The silicon slice is then placed in a diffusion furnace at approximately 750° to 825° centigrade. In the diffusion furnace an impurity, e.g. phosphorus is diffused into the top surface of the silicon slice for about 5–10 minutes. A diffusion gas comprising $O_2$, $N_2$ and $PH_3$ (source of phosphorus) may be fed into the diffusion furnace at a rate of 1000 cc/min for $N_2$; 5000 cc/min of 99% Argon, 1% $PH_3$; and 75 cc/min of $O_2$. Diffusion of the phosphorus in this manner results in the silicon slice having a first layer 2 of first type conductivity (n-type) separated from a second layer 3 of second type conductivity (p-type) by a shallow (i.e. ~ 1000 A), diffused p-n junction. The above process for making a silicon slice having a shallow p-n junction is described in the Lindmayer application. The non-crystalline tantalum pentoxide, anti-reflective coating 6 and metallic grid 5 are now ready to be placed on the silicon slice.

Figure 2A:
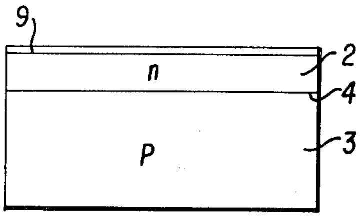
FIGS. 2A–8B are side views of the solar cell of FIG. 1 at various stages of the process for making it.
Figure 2B:
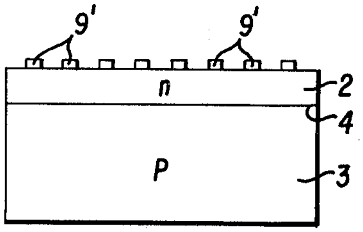
Figure 9:
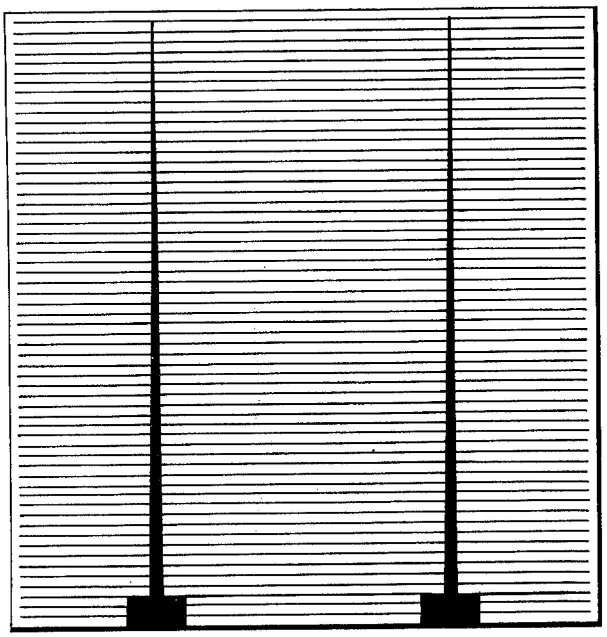
FIG. 9 shows a photo mask which is used during various steps of the present invention.

Referring to FIG. 2A there is shown the silicon slice having the layer 2 of n-type conductivity separated from a layer 3 of p-type conductivity by a shallow p-n junction 4. A layer 9 of photoresist material is then first placed on the entire top surface of n-type layer 2. The photoresist may be any known photoresist such as the AZ-111 resist. Then, a photo-mask (e.g. (see FIG. 9) having a pattern identical to the pattern desired for the top metallic grid 5 (FIG. 1) is placed over the photoresist material 9. The top surface of layer 2 is then exposed to ultraviolet light through the photo-mask. The photo-mask is then removed and the layer of photoresist developed with any known developer which is recommended for use with AZ-111 photoresist. The top surface of layer 2 is then rinsed thereby removing the photoresist which was exposed to light, but leaving a pattern of photoresist material 9' on the top surface of layer 2 as shown in FIG. 2B. At this point the pattern of photoresist material 9' is identical to the metallic grid pattern 5 to be eventually placed on the top surface of layer 2.

Figure 3:
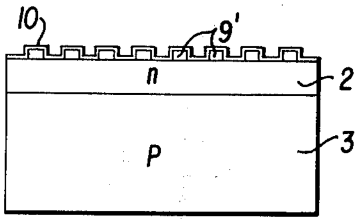

Referring to FIG. 3, a layer 10 of elemental tantalum is then evaporated over the top surface of layer 2 including photoresist layer 9' by means of an electron beam evaporation technique. The layer 10 of elemental tantalum should be approximately 200 A in order to provide, as will be described, an appropriate thickness for the layer of $Ta_2O_5$. Though the electron beam evaporation technique is well known in the art, certain precautions should be taken. First, the amount of elemental tantalum which is bombarded by the electron beam should be relatively small. The reason for this is to prevent undue thermal radiation from the hot tantalum metal, the result of which may cause the photoresist material 9' to bake onto n-type layer 2, thereby preventing the photoresist 9' from being lifted off the top surface, as will be described. In addition, the p-n silicon slice should be shielded from any electron damage which may result from a certain number of electrons straying away from the focused beam of electrons (directed towards the tantalum) and finding their way to the layer 2. The shield may comprise a metal, at positive potential, which will attract any stray electrons, thereby preventing them from reaching p-n junction 4. Finally, the tantalum metal itself should be absent of any impurities which, if deposited on layer 2, may diffuse into layer 2 during the oxidation process to be described. These impurities could damage the p-n junction 4.

The next step in the process is to remove the photoresist material 9' from the top surface of layer 2. Removal of the photoresist 9' is accomplished by the well-known "lift-off" technique in which the photoresist to be lifted off is dipped in acetone, or some other chemical suitable for use with AZ-111, which is in an ultrasonic bath. The result of the "lift-off" process is to lift off not only the photoresist 9', but also the elemental tantalum which was evaporated onto such photoresist. Structurally, therefore, as seen from FIG. 4, at this step in the process there is on the top surface of layer 2 a pattern of bare silicon coinciding with the desired metallic grid pattern 5 and a layer of elemental tantalum 10 on the remaining areas.

Figure 4:
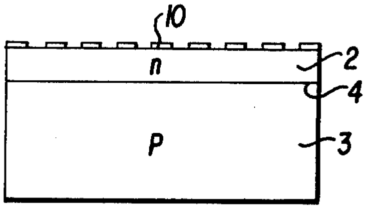

The elemental tantalum 10 on the surface layer 2 is now ready to be oxidized into non-crystalline tantalum pentoxide by means of one of two oxidation techniques. In the first technique, known as thermal oxidation, the p-n silicon slice of FIG. 4 is placed into a furnace which has oxygen flowing through it. The p-n silicon slice is exposed in the furnace to a temperature of about 500° centigrade for about 10 minutes and then removed. Under these conditions the resulting index of refraction of the oxide of tantalum is 2.25 which means that it is non-crystalline tantalum pentoxide. The desirable optical properties of the tantalum pentoxide anti-reflective coating may, however, be obtained in a relatively short time by using oxidation temperatures ranging from about 450°–525° centigrade. In the above oxidation process a tendency exists to develop non-uniform oxidation (the edges of the cell will not oxidize fully). A uniform oxidation can be assured by a temperature program whereby the slices are loaded into the furnace at 350°C and then allowing the furnace to rise slowly to the final oxidation temperature.

Figure 5:
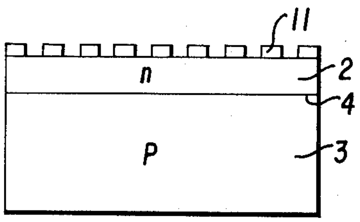

The second oxidation technique, employing the process known as anodic oxidation, would require the use of a platinum cathode as one electrode and the silicon slice of FIG. 4 as the anode or second electrode. Both electrodes are immersed in a known electrolyte and a current allowed to pass therethrough. As one example, the anodic oxidation process may last for approximately 20 minutes commencing with an initial current of 1 milliampere. The use of an organic, non-aqueous electrolyte, such as tetrahydrofurfuryl alcohol, is preferred since this will result in a uniform, non-crystalline tantalum pentoxide firmly adhering to the top surface of layer 2. The result of both thermal or anodic oxidation is a layer 11 of non-crystalline tantalum pentoxide on the top surface of layer 2 as shown in FIG. 5. The layer of non-crystalline tantalum pentoxide would be approximately 550 A thick in order to produce a quarter wave match at 0.5 microns.

Figure 6A:
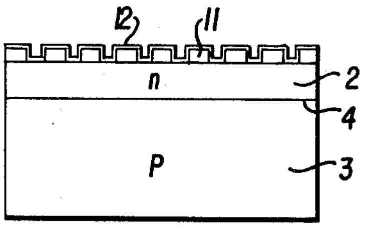
Figure 6B:
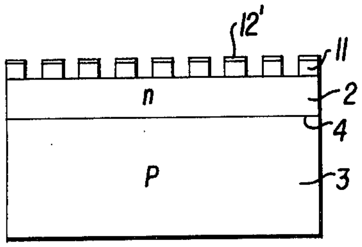

The metallic grid 5 is now ready to be placed on the top surface of layer 2 with the use of a second photolithography process. A layer of photoresist material 12, e.g. AZ-111 type, (see FIG. 6A) is placed over the entire top surface of layer 2 including the layer 11 of non-crystalline tantalum pentoxide. The negative of the photo-mask which was used previously is then placed over the top surface of layer 2 which is then exposed to light. The photo-mask is then removed and the photoresist 12 developed and rinsed as was described above. The result is a layer 12' of photoresist only over the layer 11 of non-crystalline tantalum pentoxide, as shown in FIG. 6B.

Figure 7:
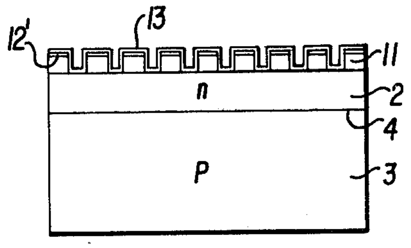
Figure 8A:
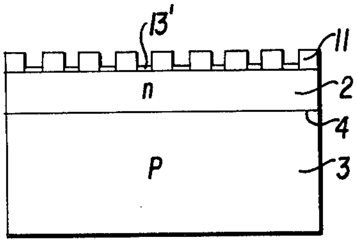
Figure 8B:
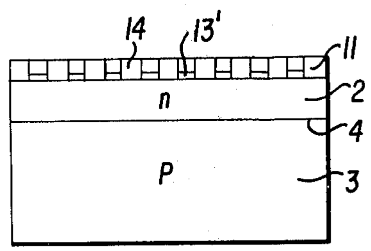

Referring to FIG. 7, a metallization (contact) layer 13 such as chrome and gold, of about 2000 A, is then placed (e.g. by vacuum evaporation) over the entire top surface of layer 2. Again, using the known "lift-off" process mentioned above, the photoresist layer 12' over the amorphous, tantalum pentoxide layer 11 is removed, thereby lifting off the chrome and gold layer 13 on such photoresist, but leaving a layer 13' of chrome and gold, as shown in FIG. 8A. A maximum chrome and gold layer of about 2000 A should be used to enable the underlying photoresist 12 to be lifted off. Finally, as shown in FIG. 8B, a layer 14 of silver is electro-plated over the remaining chrome and gold layer 13' to build up the thickness of the metallic grid 5 to approximately 5 microns. The back contact 8 may then be put on the back of layer 3 in a conventional manner.

A second method for providing a non-crystalline tantalum pentoxide, anti-reflective coating comprises the following steps. First a p-n silicon slice having the metallic grid 5 is prepared using the above-mentioned techniques including "lift-off" photolithography. Then, elemental tantalum is evaporated over the entire surface of the p-n silicon slice and oxidized, as described above, into non-crystalline tantalum pentoxide. An advantage of this method is the relative simplicity with which both the metallic grid and anti-reflective coating are placed on the silicon slice. However, with respect to thermal oxidation, the relatively high oxidation temperatures may cause unwanted interaction between the p-n junction and the metallic grid or unavoidable impurities.

All of the above methods for incorporating the metallic grid onto the solar cell have included the use of the technique known as "lift-off" photolithography; however, the present invention is not to be construed as limited to such technique. Other suitable techniques for providing a metallic grid including a photoengraving technique or the technique of evaporation through a metal mask may be used.

Figure 10:
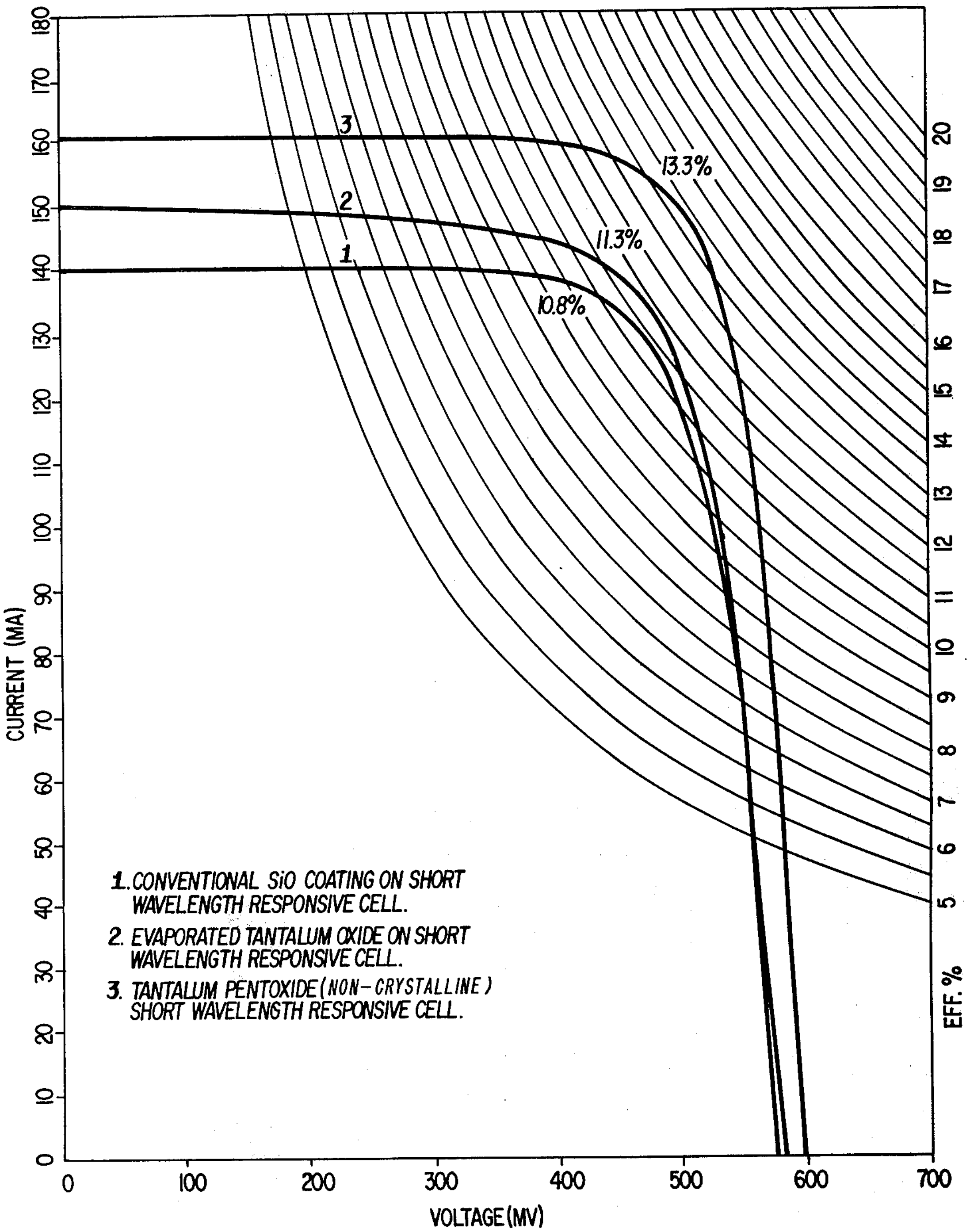
FIG. 10 is a graph showing results obtainable with the present invention in comparision with other types of anti-reflective coatings.

Referring to FIG. 10, there is shown a graph of the solar cell current output vs. the cell voltage output including constant efficiency (electrical power output/solar cell input) lines for three different anti-reflective coatings under space application conditions. The three anti-reflective coatings were tested in connection with a silicon solar cell having a response to light in the short wavelength region and quartz cover slide. The coatings include (1) a conventional $S_iO_x$ coating used in present day solar cells, (2) a tantalum oxide coating which was placed on the solar cell by evaporation of tantalum oxide and (3) non-crystalline tantalum pentoxide formed by oxidizing elemental tantalum in accordance with the present invention. From this graph it can readily be seen that the efficiency of such solar cells having the non-crystalline tantalum pentoxide coating thereon is the highest at about 13.3%. This efficiency is significantly greater than obtainable with the conventionally used $S_iO_x$ coating or the evaporated tantalum oxide coating. It should also be noted that the above 13.3% efficiency figure could be increased by making the relatively thin, silicon solar slice responsive to light in the red wavelength region: however, this would result in the more rapid degradation of such a solar cell due to radiation damage.

It should further be understood that the anti-reflective coating of the present invention is suitable for use with such short wavelength responsive solar cells which do not employ cover slides. A lack of a cover slide, however, would reduce the efficiency shown in FIG. 10 since more light would be reflected from the non-crystalline tantalum pentoxide coating than would be with the cover slide present. Comparable reduction in efficiencies would occur with other types of anti-reflective coatings for the same reason of increased light reflection.

We claim:

1. A method of placing an electrode and an anti-reflective non-crystalline tantalum pentoxide coating on a surface of a solar cell which is responsive to light, inclusively, in the blue-violet region of the spectrum, said method comprising the steps of:

a. forming a metallic collector electrode in contact with a first patterned part of said top surface,
b. depositing elemental tantalum on at least the part of said top surface other than said first patterned part, and
c. oxidizing said elemental tantalum under conditions to provide substantially non-crystalline tantalum pentoxide on at least the part of said top surface other than said first patterned part.

2. The method as claimed in claim 1 wherein the step of depositing elemental tantalum comprises the ordered steps of:

a. placing a first layer of photoresist on the surface of the solar cell through which light enters;
b. exposing said first layer of photoresist to light through a first mask having a pattern similar to the desired pattern of said metallic collector electrode;
c. developing and rinsing said first layer of photoresist;
d. depositing a layer of elemental tantalum over said surface including the layer of photoresist which remained after developing and rinsing; and
e. lifting-off said remaining photoresist and the portion of said elemental tantalum overlaying said photoresist.

3. The method of claim 1 wherein the step of forming a metallic collector electrode comprises the ordered steps of:

a. placing a second layer of photoresist covering the oxidized elemental tantalum and the exposed surface of said solar cell.
b. exposing said second layer of photoresist to light through a second mask which is a negative of said first mask, c. developing and rinsing said second layer of photoresist, thereby leaving said layer of photoresist only over said oxidized elemental tantalum,
d. placing a layer of metal, suitable for use as a current collector, over said surface, including the exposed portions of said solar cell surface and said remaining layer of photoresist, and
e. lifting-off said remaining layer of photoresist and the portion of said metal layer overlaying said photoresist.

4. The method of claim 3 wherein the step of oxidizing comprises thermally oxidizing said elemental tantalum at temperatures between 350° and 525° C to provide substantially non-crystalline tantalum pentoxide on at least the part of said top surface other than said first patterned part.

5. The method of claim 1 wherein the step of oxidizing comprises anodic oxidation.

6. The method of claim 5 wherein said anodic oxidation occurs for a period of time sufficient to acquire tantalum pentoxide having an index of refraction of 2.25.

7. The method of claim 5 wherein the step of anodic oxidation comprises immersing said solar cell with elemental tantalum thereon in an electrolyte and connecting said cell as an anode of an electrolyte circuit, immersing a platinum cathode in said electrolyte, and passing a current through said electrolyte for a sufficient time to anodically oxidize said tantalum.

8. A method of placing an electrode and an anti-reflective non-crystalline tantalum pentoxide coating on a surface of a solar cell which is responsive to light, inclusively, in the blue-violet region of the spectrum, said method comprising the steps of:

a. forming a metallic collector electrode in contact with a first patterned part of said top surface,
b. depositing elemental tantalum on at least the part of said top surface other than said first patterned part, and
c. thermally oxidizing said elemental tantalum at temperatures between 350° and 525° C to provide substantially non-crystalline tantalum pentoxide on at least the part of said top surface other than said first patterned part.

9. A method of placing an electrode and an anti-reflective non-crystalline tantalum pentoxide coating on a surface of a solar cell which is responsive to light, inclusively, in the blue-violet region of the spectrum, said method comprising the steps of:

a. placing a first layer of photoresist on the surface of the solar cell through which light enters;
b. exposing said first layer of photoresist to light through a first mask having a pattern similar to the desired pattern of a metallic collector electrode;
c. developing and rinsing said first layer of photoresist;
d. depositing a layer of elemental tantalum over said surface including the layer of photoresist which remained after developing and rinsing:
e. lifting-off said remaining photoresist in the portion of said elemental tantalum overlying said photoresist to result in a pattern of elemental tantalum on said solar cell surface;
f. thermally oxidizing said patterned elemental tantalum to provide substantially non-crystalline tantalum pentoxide by heating said elemental tantalum in an oxidizing atmosphere initially at about 350°C and then raising the temperature to a desired temperature within the range of 450°–525°C;

g. placing a second layer of photoresist covering the oxidized elemental tantalum and the exposed surface of said solar cell;

h. exposing said second layer of photoresist to light through a second mask which is a negative of said first mask;

i. developing and rinsing said second layer of photoresist thereby leaving said layer of photoresist only over said oxidized elemental tantalum;

j. placing a layer of metal, suitable for use as a current collector over said surface including the exposed portions of said solar cell surface and said remaining layer of photoresist; and k. lifting-off said remaining layer of photoresist and the portion of said metal layer overlying said photoresist.

10. The method of claim 9 wherein said metallic grid comprises chrome and gold.

11. The method of claim 10 further comprising placing a layer of silver over said chrome and gold.

12. A method of placing an electrode and an anti-reflective non-crystalline tantalum pentoxide coating on a surface of a solar cell which is responsive to light, inclusively, in the blue-violet region of the spectrum, said method comprising the steps of:

a. forming a metallic collector electrode in contact with a first patterned part of said top surface;

b. depositing elemental tantalum on at least the part of said top surface other than said first patterned part; and c. thermally oxidizing said elemental tantalum at temperatures between 350° and 525° C to provide substantially non-crystalline tantalum pentoxide on at least the part of said top surface other than said first patterned part wherein the step of thermally oxidizing comprises placing the solar cell with the elemental tantalum thereon into an oxidation furnace having oxygen flowing therethrough, said oxidation furnace being initially at a temperature of about 350° C, and gradually raising the temperature of said furnace to a final oxidation temperature in the range of 450° to 525° C.

13. The method of claim 12 wherein said thermal oxidation occurs at a temperature sufficient to acquire tantalum pentoxide having an index of refraction of 2.25.

* * * * *